United States Patent
Choi et al.

(10) Patent No.: US 8,601,680 B2
(45) Date of Patent: Dec. 10, 2013

(54) APPARATUS FOR ROLL-TO-ROLL MANUFACTURING SEMICONDUCTOR PARTS AND FEEDING METHOD THEREOF

(75) Inventors: Woo-suk Choi, Changwon (KR); Deok-heung Kim, Changwon (KR)

(73) Assignee: Samsung Techwin Co., Ltd., Changwon (KR)

( * ) Notice: Subject to any disclaimer, the term of this patent is extended or adjusted under 35 U.S.C. 154(b) by 1144 days.

(21) Appl. No.: 12/545,371

(22) Filed: Aug. 21, 2009

(65) Prior Publication Data

US 2010/0071207 A1    Mar. 25, 2010

(30) Foreign Application Priority Data

Sep. 25, 2008  (KR) .................. 10-2008-0094253

(51) Int. Cl.
*H05K 3/00* (2006.01)
*H05K 3/20* (2006.01)

(52) U.S. Cl.
USPC .............................................. 29/829; 29/831

(58) Field of Classification Search
USPC ......... 29/829, 825, 831; 118/718; 257/80, 88, 257/100, 443; 438/22, 455
See application file for complete search history.

(56) References Cited

U.S. PATENT DOCUMENTS

| | | | | |
|---|---|---|---|---|
| 4,378,264 A * | 3/1983 | Pilette et al. | ................... | 156/238 |
| 4,961,808 A * | 10/1990 | Candore | ........................ | 156/264 |
| 5,555,422 A * | 9/1996 | Nakano | ..................... | 324/750.25 |
| 7,427,782 B2 * | 9/2008 | Daniels et al. | ................... | 257/80 |
| 7,677,058 B2 * | 3/2010 | Hawtof et al. | ................. | 65/17.4 |
| 7,799,182 B2 * | 9/2010 | Lopatin et al. | ............ | 204/224 R |
| 8,181,485 B2 * | 5/2012 | Coffey et al. | ...................... | 65/90 |
| 8,298,339 B2 * | 10/2012 | Vijh et al. | ..................... | 118/718 |
| 2004/0007019 A1 * | 1/2004 | Kohli | .............................. | 65/17.6 |
| 2006/0283539 A1 * | 12/2006 | Slafer | ........................ | 156/230 |
| 2007/0026571 A1 * | 2/2007 | Daniels et al. | ............... | 438/108 |
| 2008/0280057 A1 * | 11/2008 | Hawtof et al. | ................ | 427/450 |
| 2010/0291346 A1 * | 11/2010 | Hawtof et al. | ................ | 428/141 |
| 2011/0014445 A1 * | 1/2011 | Hawtof | ........................ | 428/220 |

FOREIGN PATENT DOCUMENTS

| KR | 10-2000-0043743 A | 7/2000 |
|---|---|---|
| KR | 10-2004-0038494 A | 5/2004 |
| KR | 10-2007-0047686 A | 5/2007 |

* cited by examiner

Primary Examiner — David Angwin
(74) Attorney, Agent, or Firm — Sughrue Mion, PLLC

(57) ABSTRACT

Provided is a method of roll-to-roll processing of semiconductor parts, the method including: supplying to a processing unit a first material uncoiled from a first roll for processing at the processing unit; connecting a leading board to a leading portion of the first material before the processing so that the first material led by the leading board is processed during transfer in the processing unit along a path; cutting the leading board from the leading portion of the first material after the processing; and if a terminal edge of the first material begins to be processed at the processing unit, connecting another leading board to a leading portion of a second material uncoiled from a second roll and supplying the second material to the processing unit for processing.

3 Claims, 7 Drawing Sheets

APPARATUS FOR ROLL-TO-ROLL MANUFACTURING SEMICONDUCTOR PARTS AND FEEDING METHOD THEREOF

CROSS-REFERENCE TO RELATED PATENT APPLICATION

This application claims priority from Korean Patent Application No. 10-2008-0094253, filed on Sep. 25, 2008, in the Korean Intellectual Property Office, the disclosure of which is incorporated herein in its entirety by reference.

BACKGROUND OF THE INVENTION

1. Field of the Invention

Apparatuses and methods consistent with the present invention relate to roll-to-roll manufacturing of semiconductor parts and a method thereof, and more particularly, to manufacturing semiconductor parts relating to a roll-to-roll conveyance suitable for mass production and a method thereof.

2. Description of the Related Art

In general, roll-to-roll processing comprises continuous performance of surface processing, such as copper plating, of a roll-type raw material continuously conveyed by an apparatus for manufacturing semiconductor parts, and retrieval of a roll-type product, thereby obtaining high productivity and facilitating mass production. In roll-to-roll processing of a roll-type material, supplying a new raw material from a new roll after exhaustion of an old raw material from a previous roll is required. In this regard, related art roll-to-roll processing involves seamlessly connecting a leading portion of a new raw material from a new roll to a terminal portion of an old raw material almost exhausted in the roll-to-roll processing. However, such a connecting operation needs to be stopped and a taping operation is required each time the old raw material is near exhaustion, which deteriorates operating efficiency. Moreover, in view of the characteristics of a continuous operation, some raw material remains in an operation space for processing copper plating while the continuous operation is stopped, so that the remaining raw material is discarded, which increases consumption of raw material. Furthermore, a polymer film such as polyethylene-terephthalate (PET) has been used as a related art leading tape. A plating component coated on the leading tape, for example, a copper (Cu) plating component, is partially separated from the leading tape and is inserted into a plating tank, and functions as a seed, which changes the density of the plating component contained in the plating tank, or is retrieved from the plating tank, is re-plated on raw materials, and remains as a lump, which deteriorates plating quality significantly.

SUMMARY OF THE INVENTION

The present invention provides an apparatus and method for roll-to-roll manufacturing of semiconductor parts having an improved transfer structure that does not deteriorate an environment in which a raw material is processed.

The present invention also provides an apparatus and method for roll-to-roll manufacturing semiconductor parts having an improved transfer structure so as to increase operating efficiency of processing equipment used to properly perform surface processing with regard to a basic material that is being transferred.

According to an aspect of the present invention, there is provided an apparatus for roll-to-roll manufacturing of semiconductor parts, the apparatus including: a material supplying unit continuously supplying a material; a processing unit processing the material supplied by the material supplying unit; a transferring unit transferring the material; a tension adjusting unit adjusting tension of the material in a direction in which the material is being supplied; and a connection operating unit disposed between the material supplying unit and the processing unit so as to attach a leading board to a leading portion of the material.

The transferring unit may include a front transferring unit disposed upstream of the processing unit in a direction in which the material is being supplied and transferring the material.

The transferring unit may include a rear transferring unit disposed downstream of the processing unit in a direction in which the material is being supplied and transferring the material.

The transferring unit may include the front transferring unit and the rear transferring unit disposed upstream and downstream of the processing unit, respectively, and transferring the material.

The tension adjusting unit may include: a front adjusting unit disposed upstream of the processing unit, being lifted off and lowered onto the material, and adjusting the tension of the material; and a plurality of rollers disposed upstream and downstream of the front adjusting unit. At least one roller is disposed upstream of the front adjusting unit, and at least one roller is disposed downstream of the front adjusting unit.

The tension adjusting unit may include a first driving roller and a second driving roller disposed upstream and downstream of the first adjusting unit, respectively.

The tension adjusting unit may stop rotation of the second driving roller, clamps the leading board, and lifts the first driving roller away from the surface of the material, while lowering the front adjusting unit across the material and applying tension to a movement of the material.

When the second driving roller stops rotating and the leading board is clamped, an input roller disposed in the processing unit adjacent to the second driving roller, may stop rotating.

The tension adjusting unit may include: a rear adjusting unit disposed downstream of the processing unit, being lifted and lowered onto the material, and adjusting the tension of the material; and a plurality of rollers disposed upstream and downstream of the rear adjusting unit. At least one roller is disposed upstream of the read adjusting unit, and at least one roller is disposed downstream of the second adjusting unit.

The tension adjusting unit may include a third driving roller and a fourth driving roller disposed upstream and downstream of the rear adjusting unit.

The tension adjusting unit may stop rotation of the fourth driving roller, clamps the leading board, and lifts the third driving roller away from the surface of the material, while lowering the rear adjusting unit onto the material and applying tension to the movement of the material.

The apparatus may further include: a cutting operating stand disposed downstream of the rear adjusting unit so as to cut the leading board from the end of the material.

The transferring unit and the tension adjusting unit may share at least one roller.

According to another aspect of the present invention, there is provided a roll-to-roll processing method including: connecting a leading board to a leading portion of a material supplied from a material supplying unit that supplies the material; applying predetermined processing to the material using a processing unit when the material led by the leading board is transferred in the processing unit along a path; extracting from the processing unit the material with the leading board connected to the leading portion of the material; and cutting the leading board from the leading portion of the material extracted from the processing unit.

The method may further include adjusting tension of the material between the connecting and the applying, using a tension adjusting unit, in a direction in which the material is being transferred. The tension adjusting unit may include first and second rollers disposed upstream and downstream of the tension adjusting unit, respectively. The adjusting tension may include: stopping rotation of the second roller; clamping the leading board; lifting the first roller away from the material; lowering the tension adjusting unit onto the material; and applying tension to a movement of the material.

When the second driving roller stops rotating and the leading board is clamped, an input roller disposed in the processing unit may stop rotating.

The method may further include: adjusting tension of the material between the extracting and the cutting, using a tension adjusting unit, in a direction in which the material is being transferred. The tension adjusting unit may include first and second rollers disposed upstream and downstream of the tension adjusting unit, respectively. The adjusting tension may include: stopping rotation of the second roller; clamping the leading board; lifting the first roller away from the material; lowering the tension adjusting unit; and applying tension to a movement of the material.

The method may further include: applying tension in a direction in which the material is being transferred using a tension adjusting unit disposed upstream or downstream of the processing unit; and if it is detected that the material is near exhaustion at the processing unit, increasing tension and controlling the tension adjusting unit to output the material remaining in the tension adjusting unit.

The leading board may be a copper board or a printed circuit board (PCB).

BRIEF DESCRIPTION OF THE DRAWINGS

The above and other aspects of the present invention will become more apparent by describing in detail exemplary embodiments thereof with reference to the attached drawings, in which.

DETAILED DESCRIPTION OF EXEMPLARY EMBODIMENTS

The present invention will now be described more fully with reference to the accompanying drawings, in which exemplary embodiments are shown.

Figure 1:
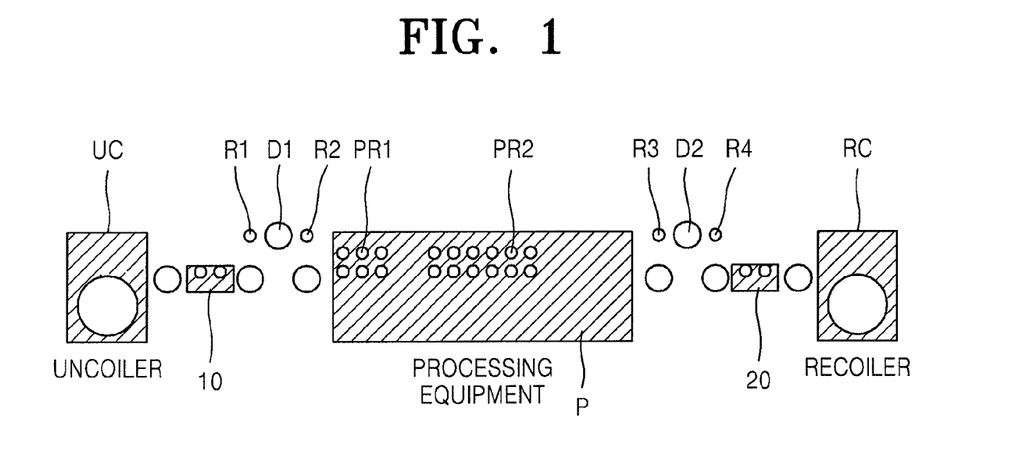
FIG. 1 illustrates an apparatus for roll-to-roll manufacturing of semiconductor parts according to an exemplary embodiment of the present invention.

FIG. 1 illustrates an apparatus for roll-to-roll manufacturing of semiconductor parts according to an exemplary embodiment. The apparatus for roll-to-roll manufacturing of semiconductor parts comprises processing equipment P disposed between an uncoiler UC, in which a roll (not shown) having a wound film type raw material is mounted, and a recoiler RC that rewinds, in the form of a roll, the completely processed raw material extracted from the uncoiler UC. The processing equipment P accommodates the continuously supplied raw material and performs appropriate processing, e.g., plating, with regard to the raw material. Although not shown, the processing equipment P may perform electroless copper plating (chemical copper plating) with regard to the continuously transferred raw material. For example, a plurality of spray nozzles for spraying plating solution along with a transfer path of the raw material may be arranged in parallel with each other in the processing equipment P. A plating tank to which a supply pump is connected may be installed on the transfer path in order to catch any surplus plating solution not coated on the raw material and supply the surplus plating solution back to the spray nozzles.

The apparatus comprises first and second driving rollers R1 and R2 that forcibly transfer the raw material in a direction in which the material is being supplied, and a supply roller assembly having a dancer roller D1 that vertically rises and falls between the first and second driving rollers R1 and R2 and controls tension of the raw material, between the uncoiler UC and the processing equipment P. Similarly, the apparatus comprises third and fourth driving rollers R3 and R4 that add transfer force in the direction in which the material is being supplied and a retrieval roller assembly having a dancer roller D2 that vertically rises and falls between the third and fourth driving rollers R3 and R4 and controls tension of the raw material, between the processing equipment P and the recoiler RC.

FIGS. 2A through 2I are diagrams for explaining transfer operations of the apparatus for roll-to-roll manufacturing of semiconductor parts according to an exemplary embodiment. The diagrams shown in FIGS. 2A through 2I explain stages of an initial transfer operation.

Figure 2A:
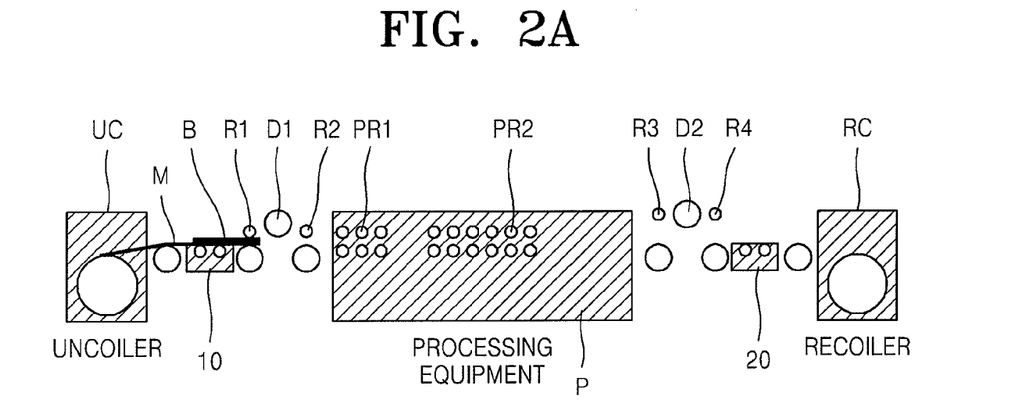
FIGS. 2A through 2I illustrates transfer operations of the apparatus for roll-to-roll manufacturing of semiconductor parts according to an exemplary embodiment of the present invention.

Referring to FIG. 2A, during an initial feeding stage during which a new raw material is supplied, after pulling a raw material M that is coiled around the uncoiler UC and extracting the raw material M toward a connection operating stand 10, a leading portion of the extracted raw material M is connected to a leading board B stably supported by the connection operating stand 10. Since the flexible raw material M may be highly skewed or deviate from a transfer path due to lack of rigidity caused by minute non-uniformity of transfer force, the leading board B is attached to the leading portion of the raw material M in order to perform stable conveyance. An example of the leading board B may be a metal sheet such as a copper thin board or a printed circuit board (PCB). The leading board B may be formed of a material having sufficient rigidity or a material having thickness for sufficient rigidity. For example, the PCB that is used as the leading board B may have a structure in which copper thin layers are stacked on both sides of an insulation material such as Flame Retardant 4 (FR-4). In a transfer operation for plating, the leading board B, which has a surface layer having a good affinity with a plating solution component, may be preferred, but not necessary, in order to prevent a plating solution coated on the leading board B from being separated and contaminating the plating environment.

Figure 2B:
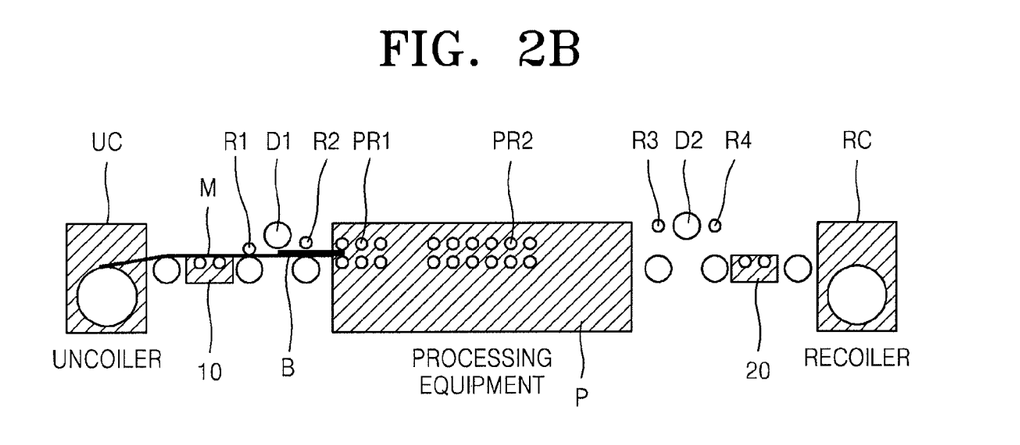
Figure 2C:
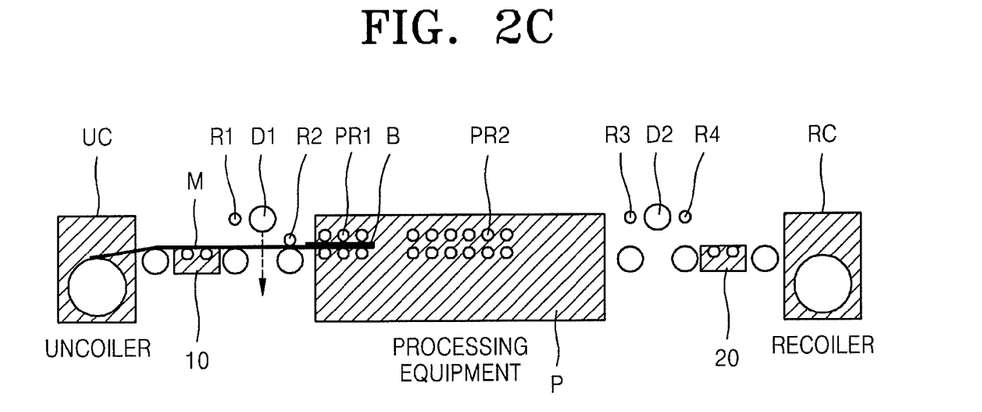
Figure 2D:
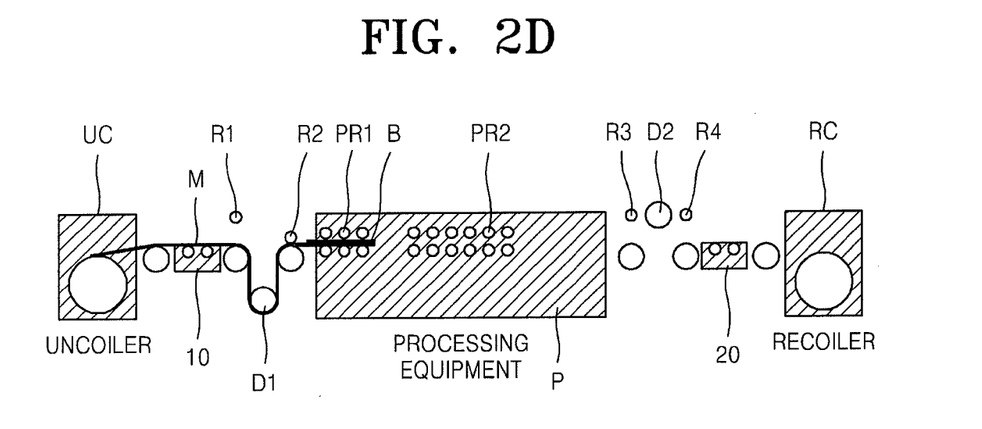

When the leading board B is completely connected to the leading portion of the raw material M, referring to FIG. 2B, the first and second driving rollers R1 and R2 contacting the leading board B are operated and transfer force is applied to the leading board B so that the leading board B pulls the raw material M into the processing equipment P. In this regard, rollers contacting other parts of the raw material M and paired with the first and second driving rollers R1 and R2 may rotate in an idle status and guide transfer of the leading board B and the raw material M. The leading board B that enters the processing equipment P is disposed between a plurality of pairs of input rollers PR1 that are arranged in an input terminal, and the leading board B is transferred into the processing equipment P. For example, if a detection sensor (not shown) detects that the leading board B passes through the second driving roller R2, referring to FIGS. 2C and 2D, rotation of the second driving roller R2 and the input rollers PR1 is stopped and the leading board B is clamped, and simultaneously, the first driving roller R1 is lifted from the surface of the raw material M in order to avoid restriction of transfer of the raw material M, whereas the dancer roller D1 disposed between the first and second driving rollers R1 and R2 is lowered onto the raw material M, and contacts the surface of the raw material M, so that the dancer roller D1 and the raw material M is further lowered to a predetermined depth. In spite of the second driving roller R2 stopping, the raw material M is continuously supplied to the uncoiler UC due to the lowering of the dancer roller D1, and the raw material M is accumulated around the dancer roller D1 according to the predetermined depth of the dancer roller D1, and simultaneously the raw material M is tightly pulled in a lengthwise direction, thereby controlling the tension on the raw material M. The accumulation of the raw material M in this manner absorbs a difference in transfer speed between stages along the transfer path, thereby preventing an excessive tension or a tension loss and maintaining an appropriate tension status. Meanwhile, if the dancer roller D1 is completely lowered, the rotation of the second driving roller R2 and the input roller PR1 is resumed and thus the raw material M connected to the leading board B is forcibly transferred in a direction in which the material is being supplied. A plurality of output rollers PR2 disposed in the processing equipment P start rotating.

Although not shown, a series of processing operations with regard to the continuously transferred raw material M, e.g., electroless copper plating (chemical copper plating), may be performed in the processing equipment P. According to the related art roll-to-roll processing of connecting an old raw material and a new raw material by using a leading tape formed of a polyethylene-terephthalate (PET) disposed between the old and new raw materials, since the leading tape has a low affinity with the plating solution in view of the characteristics of the leading tape, plating particles that are partially separated from the leading tape act as seeds in a plating tank, which reduces plating density or contaminates the plating solution in the plating tank. However, when the old raw material and the new raw material are not artificially connected to each other but are disconnected from each other, a method of connecting the leading board to a leading portion of the new raw material for stable transfer uses a board material having a good affinity with the plating solution, thereby resolving the problem caused by the separation of the plating solution.

Figure 2E:
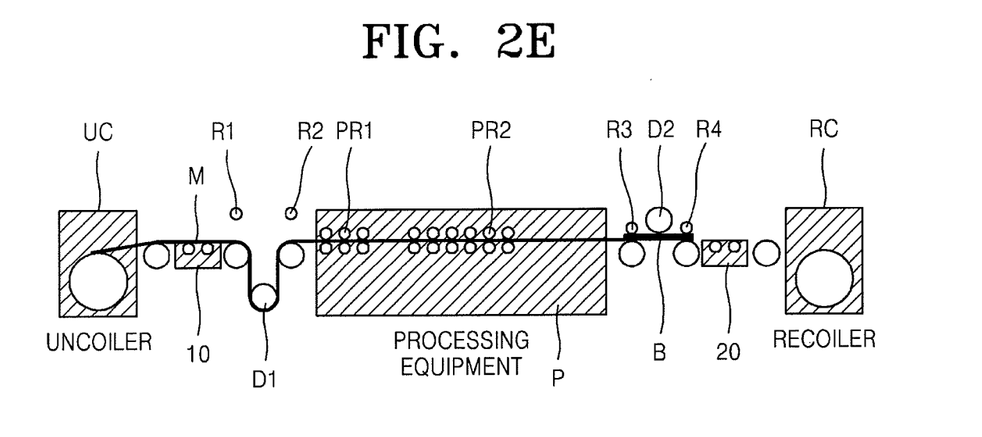

Referring to FIG. 2E, the leading board B extracted from the processing equipment P is forcibly transferred by rotating the third and fourth driving rollers R3 and R4 disposed between the processing equipment P and the recoiler RC. Rollers contacting other parts of the raw material M and paired with the third and fourth driving rollers R3 and R4 may rotate in an idle status and guide transfer of the leading board B. For example, if a detection sensor (not shown) detects that the leading board B passes through the third and fourth driving rollers R3 and R4, the second driving roller R2 is lifted from the surface of the raw material M that is engaged with the third and fourth driving rollers R3 and R4 and the raw material M is stably transferred.

Figure 2F:
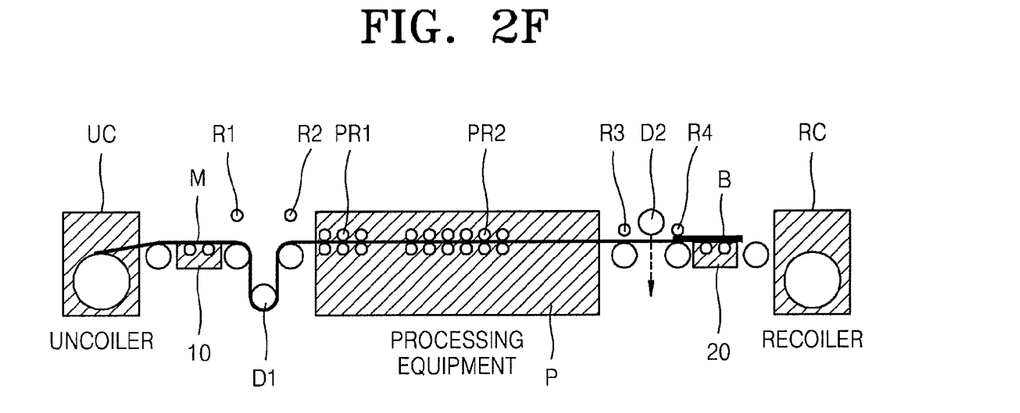
Figure 2G:
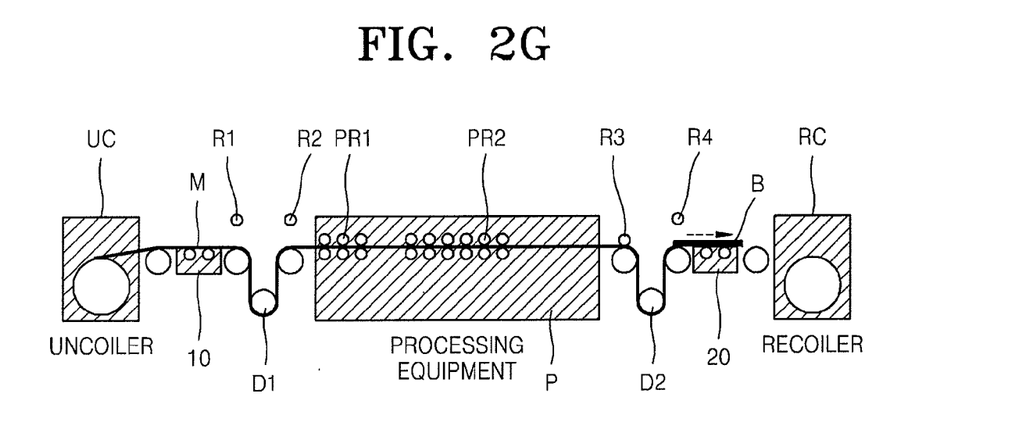
Figure 2H:
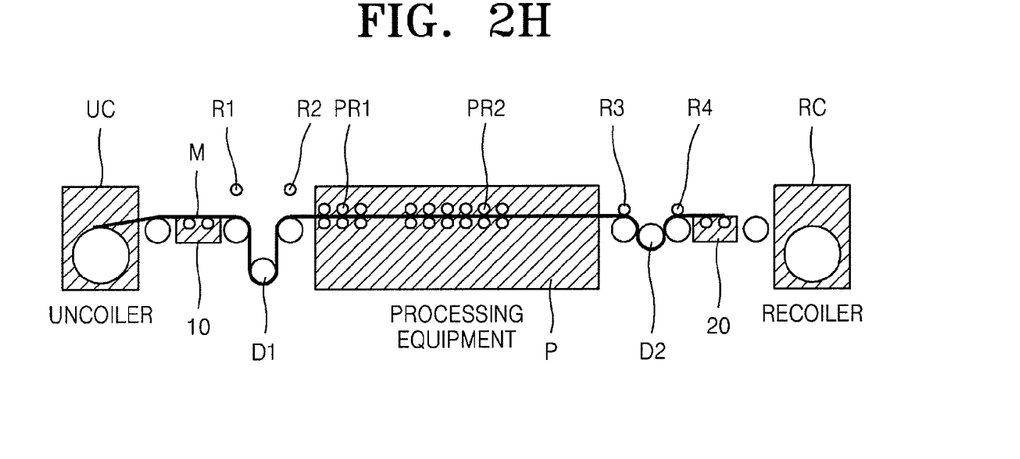
Figure 2I:
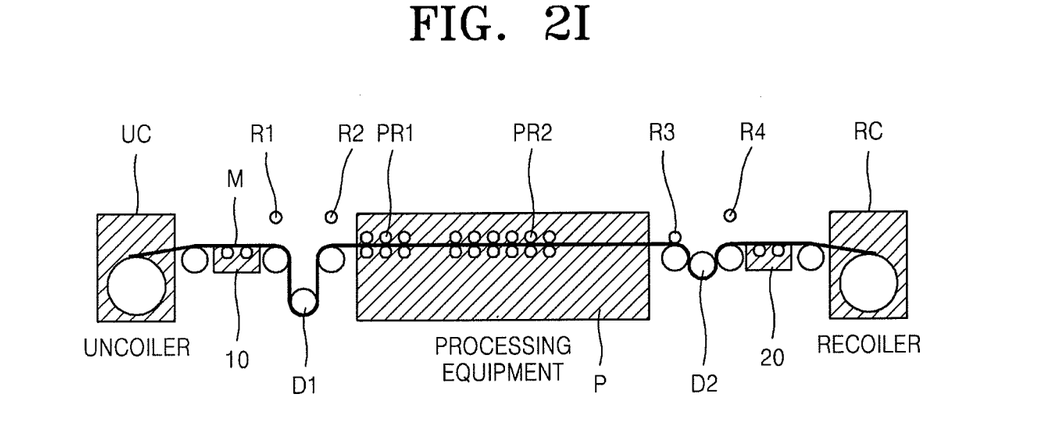

Referring to FIG. 2F, for example, if a detection sensor (not shown) detects that the leading board B passes through the fourth driving roller R4, rotation of the fourth driving roller R4 is stopped and the leading board B (or the raw material M) is clamped, and simultaneously, the third driving roller R3 is lifted from the surface of the raw material M in order to avoid restriction of transfer of the raw material M, whereas, referring to FIG. 2G, the dancer roller D2 disposed between the third and fourth driving rollers R3 and R4 is lowered to contact the raw material M and further lowered to a predetermined depth while contacting the surface of the raw material M, thereby tightly maintaining the raw material M and accumulating the raw material M around the dancer roller D2. The accumulation of the raw material M absorbs a difference in transfer speed between stages along the transfer path, thereby preventing an excessive tension or a tension loss and maintaining an appropriate tension status. Meanwhile, if the dancer roller D2 is completely lowered to the predetermined depth, the third driving roller R3 is lowered onto the surface of the raw material M, the raw material M is clamped, the fourth driving roller R4 is lifted from the surface of the leading board B (or the raw material M) in order to avoid restriction of transfer of the raw material M, the leading board B is pulled toward a cutting operating stand 20, referring to FIG. 2H, the fourth driving roller R4 is lowered and the raw material M is clamped. The leading board B is cut from the leading portion of the raw material M, referring to FIG. 2I, the fourth driving roller R4 is lifted from the surface of the raw material M, the raw material M freely moves, and the leading portion of the raw material M is connected to the recoiler RC.

Figure 3:
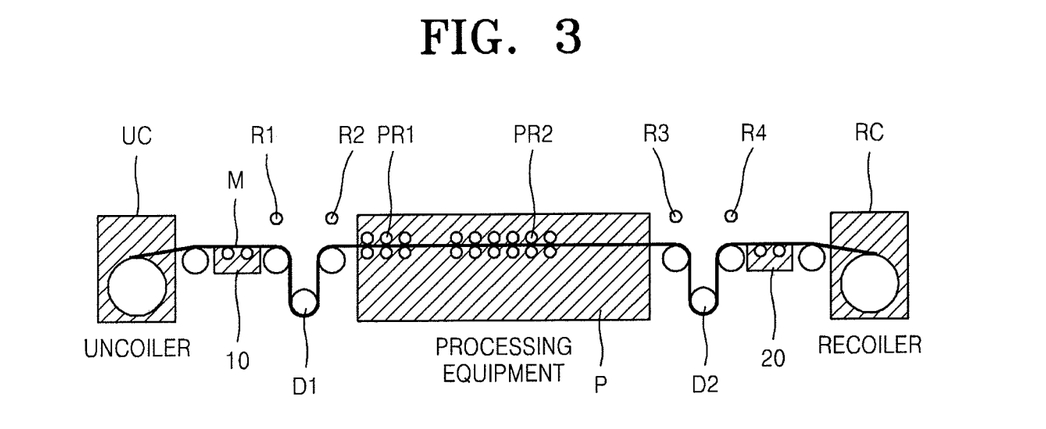
FIG. 3 illustrates a normal operating status in which a roll-to-roll transferring method is used, according to an exemplary embodiment of the present invention.

After the leading portion of the raw material M, from which the leading board is removed, is connected to the recoiler RC, referring to FIG. 3, the raw material M is continuously transferred and processed, the raw material M extracted from the uncoiler RC at one end of the apparatus for roll-to-roll manufacturing of semiconductor parts passes through the processing equipment P along the transfer path, e.g., the electroless copper plating is performed with regard to the raw material M, and the completely processed raw material M is coiled around the recoiler RC at the other end of the apparatus for roll-to-roll manufacturing of semiconductor parts.

Figure 4A:
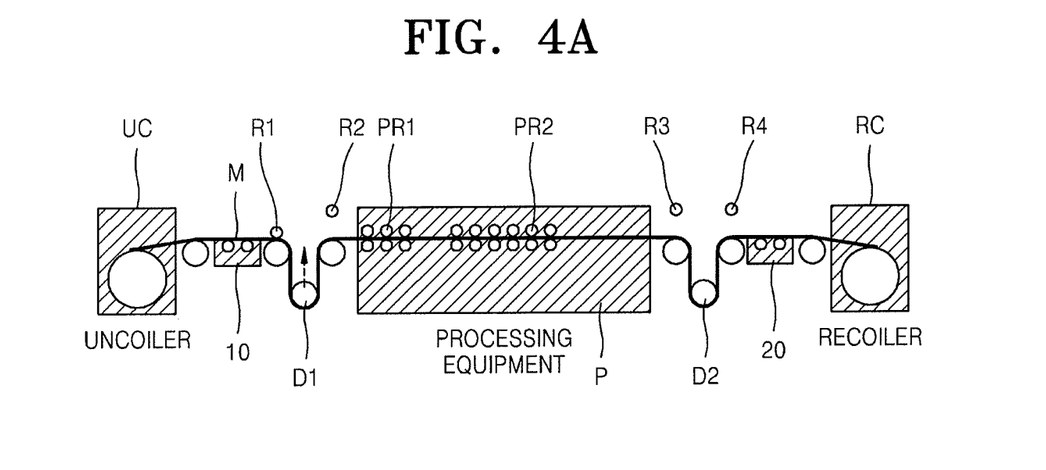
FIGS. 4A through 4G illustrates transfer operations when a transfer of a unit roll ends and a roll-to-roll transferring method is used, according to an exemplary embodiment of the present invention.
Figure 4B:
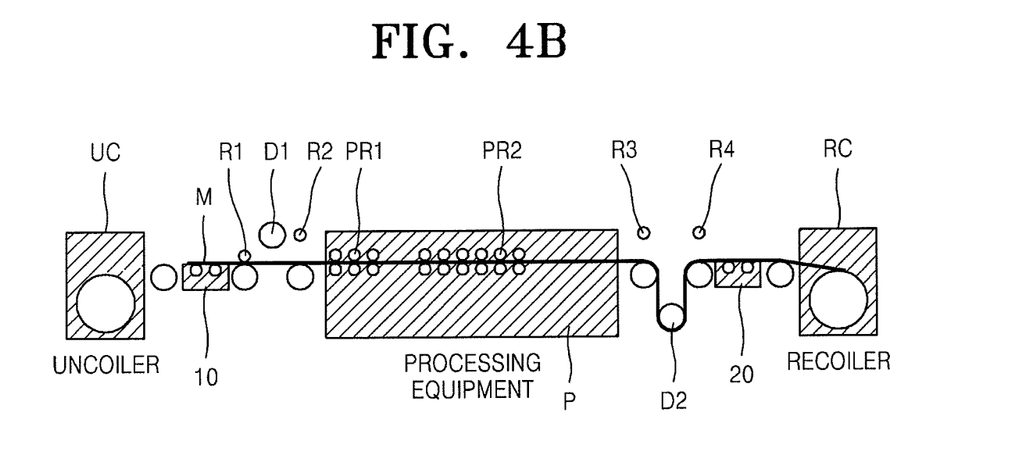
Figure 4C:
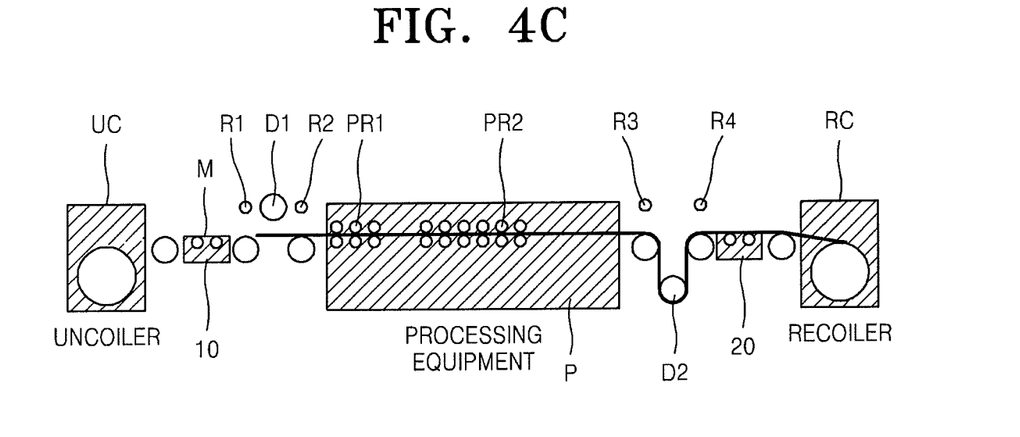

FIGS. 4A through 4G illustrate transfer operations when transfer of a unit roll ends, according to an exemplary embodiment. Referring to FIG. 4A, an exhaustion of the raw material M wound around the uncoiler UC is detected, the first driving roller R1 is lowered to the surface of the raw material M, the raw material M is clamped, and the dancer roller D1 is lifted so that the accumulated raw material M is supplied in a direction in which the material is being supplied. Referring to FIG. 4B, if the dancer roller D1 is completely lifted to the highest position, the first driving roller R1 rotates, the raw material M is forcibly transferred in the forward direction in which the material is being supplied, and, referring to FIG. 4C, if a terminal edge of the raw material M leaves the first driving roller R1, the first driving roller R1 is lifted.

Figure 4D:
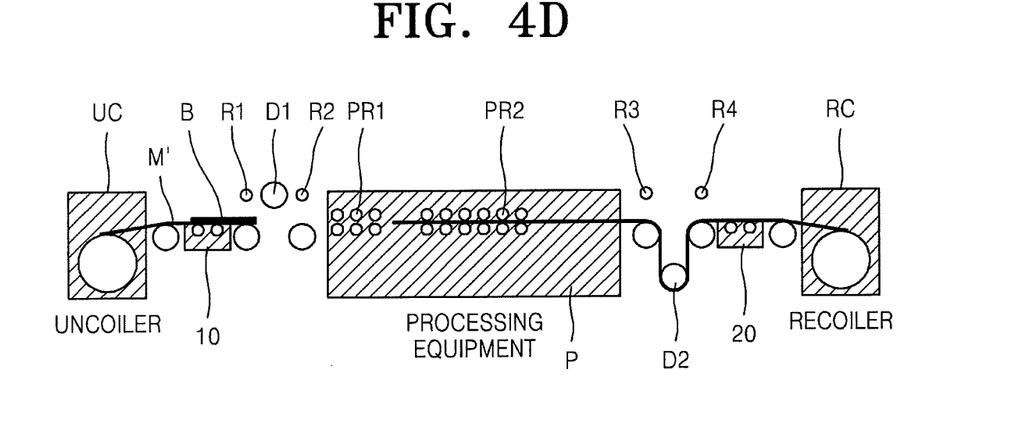

Referring to FIG. 4D, if the terminal edge of the raw material M enters the processing equipment P, a new raw material M' wound around a new roll is provided and, simultaneously, a leading portion of the new raw material M' is connected to the leading board B so that the transfer operations shown in FIGS. 2A through 2I are sequentially performed. In this regard, description and the drawings of the new raw material M', which are the same as those of FIGS. 2A through 2I, will not be repeated here.

Figure 4E:
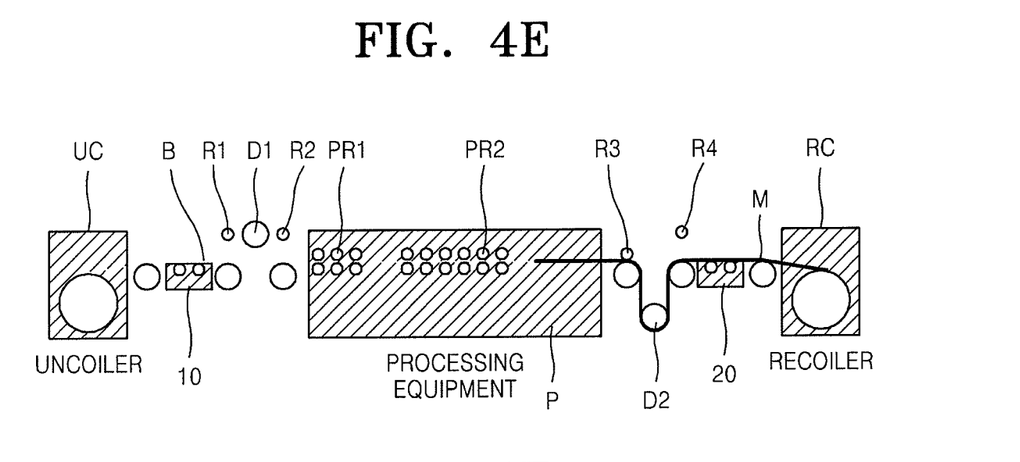
Figure 4F:
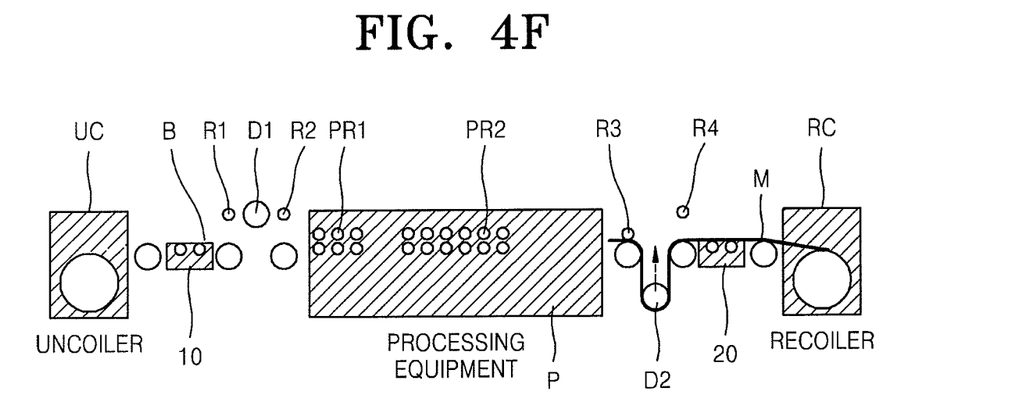
Figure 4G:
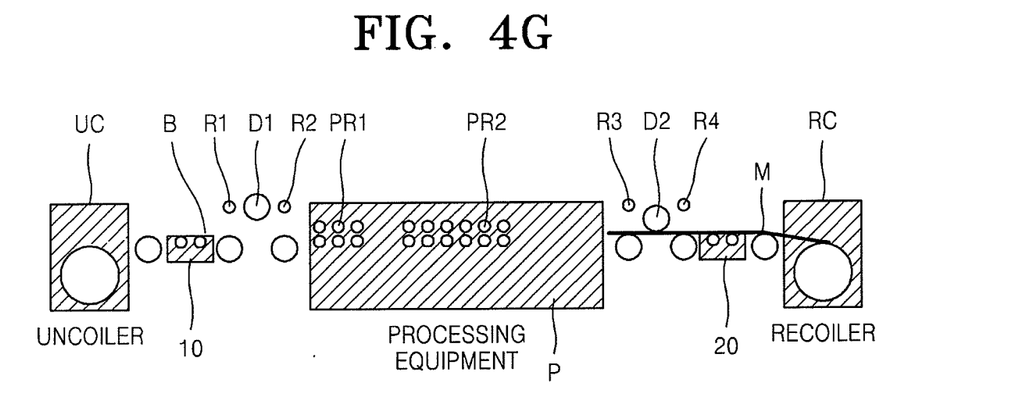

Referring to FIG. 4E, if the terminal edge of the raw material M approaches an exit of the processing equipment P, the third driving roller R3 adjacent to the exit of the processing equipment P is lowered, contacts the surface of the raw material M, and starts rotating. Referring to FIG. 4F, if it is detected that the terminal edge of the raw material M is out of the processing equipment P, the dancer roller D2 is lifted and the raw materials M accumulated around the dancer roller D2 are supplied. Referring to FIG. 4G, if the dancer roller D2 is lifted to a highest position, rotation of the recoiler RC is stopped, the raw materials M remaining on a transfer line are manually coiled, and thus a production process ends.

Figure 5:
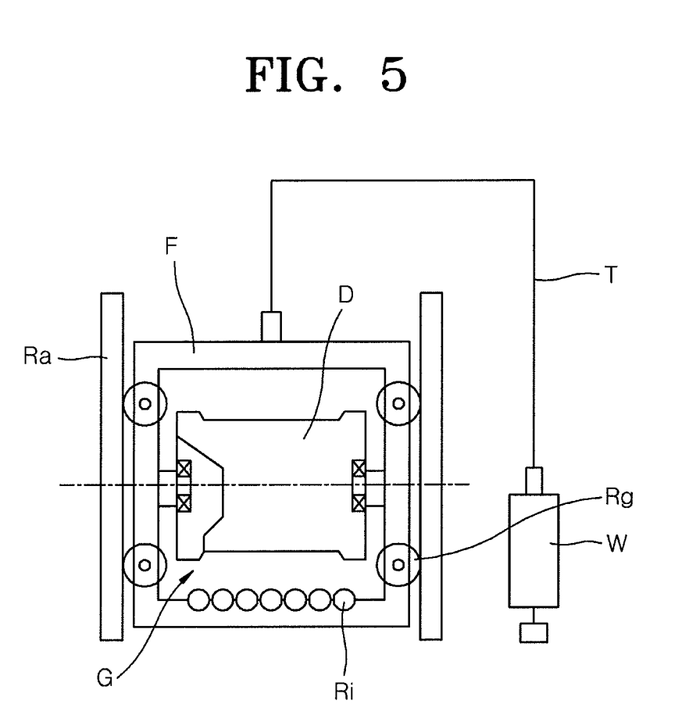
FIG. 5 is a vertical cross-sectional view of a carrier structure used to drive a dancer roller, according to an exemplary embodiment of the present invention.

FIG. 5 is a vertical cross-sectional view of a carrier structure used to drive a dancer roller used in the transfer operations of an apparatus for roll-to-roll manufacturing of semiconductor parts as described above. Referring to FIG. 5, a dancer roller D is rotatably disposed in a carrier frame F between parallel-arranged guide rails Ra. Guide rollers Rg are symmetrically and uniformly disposed in the carrier frame F, vertically travel along the guide rails Ra, and guide the lifting and lowering of the dancer roller D. An idle roller Ri disposed in the carrier frame F contacts a surface of the raw material M (as shown in FIGS. 2A-4G), guides transfer of the raw material M by using a gap G through which the raw material M being transferred passes, and, when the dancer roller D is at the highest position, the idle roller Ri is disposed in an appropriate location to contact the raw material. The carrier frame F that supports the dancer roller D is subject to a vertical pulling power through a steel wire T such as piano wire. A load body W having the same load as the carrier frame F may be connected to the opposite side of the steel wire T. The load body W and the carrier frame F are generally balanced at both sides of the steel wire T, thereby more stably pulling the steel wire T.

The apparatus for roll-to-roll manufacturing of semiconductor parts and a feeding method thereof according to the exemplary embodiments transfer a raw material that is disconnected in a roll unit without artificially connecting an old raw material and a new raw material, and instead, connect a leading board for providing sufficient rigidity to a leading portion of the raw material, thereby maintaining transfer stability. The related art roll-to-roll processing for continuously connecting an old raw material and a new raw material by using a leading tape stops the transfer of the raw material when the old raw material is almost exhausted, and connects an edge of the old raw material and an end of the new raw material, which reduces driving efficiency due to repeated intermittent stopping whenever a unit roll is almost exhausted, and the raw material remaining in processing equipment during a stop period is discarded as industrial waste. Also, the leading tape connecting the old raw material and the new raw material is formed of a polymer resin such as PET, which has a low affinity with a metal plating component such as a copper component, and thus a plating solution does not adhere to the leading tape, some plating particles are frequently separated from the leading tape into a plating tank, which reduces plating density or contaminates the plating solution. Also, when the separated plating particles are coated on the raw material by using a retrieval pump, the plating particles remain in the form of a lump on the raw material, which deteriorates plating quality significantly.

However, the roll-to-roll processing according to the exemplary embodiments does not need to stop transferring an old raw material so as to install a new raw material, so that it is possible to continuously process the raw material without stopping equipment operation, thereby dramatically increasing driving efficiency of the equipment, and preventing consumption of the raw material due to equipment stoppage. Furthermore, a leading board having a high affinity with a plating component, other than a polymer resin material such as PET, prevents the plating solution coated on the leading board from being separated and the plating quality from being damaged, thereby increasing the plating quality.

The aforementioned exemplary embodiments do not use a leading tape used to artificially connect the old raw material and the new raw material, thereby preventing contamination of an operating environment and deterioration of the plating quality such as separation of the plating solution caused by the characteristics of the surface or material of the leading tape, and the aforementioned exemplary embodiments provide an apparatus for roll-to-roll manufacturing of semiconductor parts, capable of stably transferring the raw material, and a feed method. Also, it is unnecessary to stop the equipment so as to perform a taping operation, which increases the driving efficiency of the equipment compared to the related art, and reducing consumption of the raw material compared to the related art wherein the raw material remaining in the stopped equipment is discarded.

While the present invention has been particularly shown and described with reference to the exemplary embodiments thereof, it will be understood by those of ordinary skill in the art that various changes in form and details may be made therein without departing from the spirit and scope of the present invention as defined by the following claims.

What is claimed is:

1. A method of roll-to-roll processing of semiconductor parts, the method comprising:
   supplying to a processing unit a first material uncoiled from a first roll for processing at the processing unit;
   connecting a leading board to a leading portion of the first material before the processing so that the first material led by the leading board is processed during transfer in the processing unit along a path;
   cutting the leading board from the leading portion of the first material after the processing; and
   if a terminal edge of the first material begins to be processed at the processing unit, connecting another leading board to a leading portion of a second material uncoiled from a second roll and supplying the second material to the processing unit for processing.

2. The method of claim 1, further comprising applying tension in a direction of the transfer to the first material, using a tension adjusting unit disposed upstream or downstream of the processing unit,
   wherein the applying tension using the tension adjusting unit comprises:
      clamping the leading board to temporarily stop the transfer of the first material;
      lowering down the first material to a predetermined depth in a direction perpendicular to the direction of the transfer; and
      after the lowering down, resuming the transfer of the first material by unclamping the leading board.

3. The method of claim 2, wherein the cutting is performed after the applying tension if the applying tension is performed by the tension adjusting unit disposed downstream of the processing unit, and
   wherein, after the cutting, the first material is recoiled by a recoiler.

* * * * *